United States Patent
Barnette et al.

(10) Patent No.: US 9,444,343 B1
(45) Date of Patent: Sep. 13, 2016

(54) VOLTAGE REGULATOR USING A VARIABLE SWITCHING FREQUENCY

(71) Applicant: Lenovo Enterprise Solutions (Singapore) Pte. Ltd., Singapore (SG)

(72) Inventors: Jamaica L. Barnette, Durham, NC (US); Douglas Evans, Cary, NC (US); Brian C. Totten, Durham, NC (US)

(73) Assignee: Lenovo Enterprise Solutions (Singapore) Pte. Ltd., Singapore (SG)

( * ) Notice: Subject to any disclaimer, the term of this patent is extended or adjusted under 35 U.S.C. 154(b) by 0 days.

(21) Appl. No.: 14/795,292

(22) Filed: Jul. 9, 2015

(51) Int. Cl.
*H02M 3/158* (2006.01)
*G01R 19/00* (2006.01)

(52) U.S. Cl.
CPC .......... *H02M 3/158* (2013.01); *G01R 19/0092* (2013.01)

(58) Field of Classification Search
CPC .................................................... H02M 3/158
See application file for complete search history.

(56) References Cited

U.S. PATENT DOCUMENTS

| | | | |
|---|---|---|---|
| 6,714,426 B1 * | 3/2004 | Guo | H02M 3/1584 363/134 |
| 7,317,305 B1 * | 1/2008 | Stratakos | H02M 3/157 323/282 |
| 2014/0266130 A1 | 9/2014 | Chiang et al. | |

* cited by examiner

*Primary Examiner* — Emily P Pham
(74) *Attorney, Agent, or Firm* — Katherine S. Brown; Jeffrey L. Streets

(57) ABSTRACT

A method for controlling a voltage regulator includes monitoring an output current and an inductance of an output inductor in a voltage regulator, wherein the voltage regulator includes high-side and low-side field effect transistors both coupled to an input to the first output inductor. The high-side and low-side field-effect transistors are alternately turned on at a switching frequency, wherein only one of the field-effect transistors is turned on at a time. The method measures a change in the inductance of the output inductor resulting from the output inductor reaching current saturation and measures a rate of change in the output current of the output inductor. The switching frequency is controlled as a function of the measured change in the inductance and the measured rate of change in the output current in order to prevent an amount of current through the high-side field-effect transistor from exceeding a maximum operating current setpoint.

18 Claims, 4 Drawing Sheets

US 9,444,343 B1

VOLTAGE REGULATOR USING A VARIABLE SWITCHING FREQUENCY

BACKGROUND

1. Field of the Invention

The present invention relates to the control of a voltage regulator having a plurality of switching field-effect transistors (FETs).

2. Background of the Related Art

Modern central processing units (CPUs) experience extreme current transients, some on the order of 100% above the maximum steady state current. Depending on the design of a voltage regulator providing power to the CPU, load changes can be in the hundreds of amps, at very high slew rates. In order to meet these high current requirements, the voltage regulator usually requires an inductor having very high current saturation limits. However, such an inductor may become rather large since the physical size of an inductor is proportional to its current saturation limits.

Furthermore, age, temperature, and manufacturing imperfections can cause the current saturation limits of the inductor to become compromised or unable to perform to the inductor's specification standards. A primary concern is that an inductor with compromised performance can lead to current runaway on the power stages of the voltage regulator that provide current to a load such as the CPU.

FIG. 1 is a schematic diagram illustrating a drop in inductance of an inductor due to current saturation and the resulting current ripples that can damage various components, such as field-effect transistors of the voltage regulator. As the current flowing through the power stages and the output inductor increases near the point of current saturation, the effective inductance of the inductor core begins to decrease, thus increasing the peak current of the associated phase. As the effective output inductance decreases, the ripple current through the output inductor increases, causing undue stress on the power stage of the voltage regulator. If left unchecked, this increased ripple current can damage the switching field-effect transistors of the voltage regulator.

BRIEF SUMMARY

One embodiment of the present invention provides a method comprising monitoring an output current and an inductance of a first output inductor in a voltage regulator, wherein the voltage regulator includes a first high-side field-effect transistor and a first low-side field effect transistor both coupled to an input to the first output inductor. The method further comprises alternately turning on the first high-side field-effect transistor and the first low-side field-effect transistor at a switching frequency, wherein only one of the first high-side field-effect transistor and the first low-side field-effect transistor are turned on at any point in time. The method still further comprises measuring a change in the inductance of the first output inductor resulting from the first output inductor reaching current saturation and measuring a rate of change in the output current of the first output inductor. Then, the method controls the switching frequency as a function of the measured change in the inductance and the measured rate of change in the output current in order to prevent an amount of current through the first high-side field-effect transistor from exceeding a maximum operating current setpoint for the first high-side field-effect transistor.

Another embodiment of the present invention provides a computer program product for controlling a voltage regulator, wherein the computer program product comprises a non-transitory computer readable storage medium having program instructions embodied therewith, and wherein the program instructions are executable by a processor to cause the processor to perform a method. The method comprises monitoring an output current and an inductance of a first output inductor in a voltage regulator, wherein the voltage regulator includes a first high-side field-effect transistor and a first low-side field effect transistor both coupled to an input to the first output inductor. The method further comprises alternately turning on the first high-side field-effect transistor and the first low-side field-effect transistor at a switching frequency, wherein only one of the first high-side field-effect transistor and the first low-side field-effect transistor are turned on at any point in time. The method still further comprises measuring a change in the inductance of the first output inductor resulting from the first output inductor reaching current saturation and measuring a rate of change in the output current of the first output inductor. Then, the method controls the switching frequency as a function of the measured change in the inductance and the measured rate of change in the output current in order to prevent an amount of current through the first high-side field-effect transistor from exceeding a maximum operating current setpoint for the first high-side field-effect transistor.

DETAILED DESCRIPTION

Figure 1:
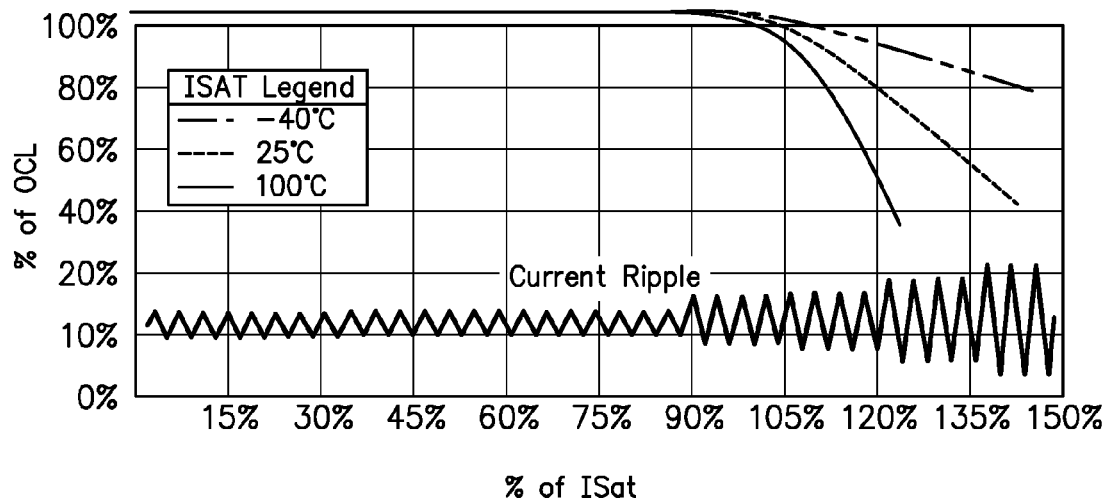
FIG. 1 is a chart of open loop inductance as a function of current saturation illustrating a drop off in inductance, and the resulting increase in current ripples, as an inductor exceeds the 100% current saturation.

One embodiment of the present invention provides a method comprising monitoring an output current and an inductance of a first output inductor in a voltage regulator, wherein the voltage regulator includes a first high-side field-effect transistor and a first low-side field effect transistor both coupled to an input to the first output inductor. The method further comprises alternately turning on the first high-side field-effect transistor and the first low-side field-effect transistor at a switching frequency, wherein only one of the first high-side field-effect transistor and the first low-side field-effect transistor are turned on at any point in time. The method still further comprises measuring a change in the inductance of the first output inductor resulting from the first output inductor reaching current saturation and measuring a rate of change in the output current of the first output inductor. Then, the method controls the switching frequency as a function of the measured change in the inductance and the measured rate of change in the output current in order to prevent an amount of current through the first high-side field-effect transistor from exceeding a maximum operating current setpoint for the first high-side field-effect transistor.

The output current and inductance of the first output inductor may be monitored and measured by a system controller of the voltage regulator. Accordingly, the system controller may prevent damage to the first high-side field-effect transistor by preventing the amount of current through the first high-side field-effect transistor from exceeding the maximum operating current setpoint for the first high-side field-effect transistor.

Embodiments of the present invention may use an output inductor having a core that is a composite material exhibiting a soft current saturation region. For example, the output inductor may have a core characterized by an inductance that declines slower with respect to increasing current than a pure ferrite core.

A further embodiment of the present invention specifically includes at least a second phase in parallel with the first phase between a voltage source and a load. Accordingly, the voltage regulator will include a first phase and a second phase, wherein the first phase includes the first high-side field-effect transistor, the first low-side field-effect transistor and the first output inductor, and wherein the second phase includes a second high-side field-effect transistor, a second low-side field-effect transistor, and a second output inductor coupled to outputs of the second high-side field-effect transistor and the second low-side field-effect transistor. Both of the first and second output inductors have their outputs coupled to a load. In such an embodiment, the method may further comprise alternately turning on the second high-side field-effect transistor and the second low-side field-effect transistor at the switching frequency, wherein only one of the second high-side field-effect transistor and the second low-side field-effect transistor are turned on at any point in time, and wherein only one of the first high-side field-effect transistor and the second high-side field-effect transistor are turned on at any point in time. If the voltage regulator gangs up power by adding several power circuits in parallel, then each circuit in parallel is a phase because they are usually 360/N degrees out of phase, where N is the number of phases.

In one option, the rate of change in the output current of the first output inductor may be determined by measuring a first output current at a first sample time, measuring a second output current at a second sample time, and dividing the difference in the first output current and the second output current by the difference in the first sample time and the second sample time.

In another option, the switching frequency may be determined as a function of the measured change in the inductance and the measured rate of change in the output current by controlling the switching frequency according to the equation:

$$Fsw = K_1 * \Delta Lsys * \Delta I$$

wherein: Fsw is the switching frequency calculated by the system controller;
$\Delta Lsys$ is the measured change in the inductance;
$\Delta I$ is the measured rate of change in the output current; and
$K_1$ is a proportional gain constant set by the system controller.

Another embodiment of the present invention provides a computer program product for controlling a voltage regulator, wherein the computer program product comprises a non-transitory computer readable storage medium having program instructions embodied therewith, and wherein the program instructions are executable by a processor to cause the processor to perform a method. The method comprises monitoring an output current and an inductance of a first output inductor in a voltage regulator, wherein the voltage regulator includes a first high-side field-effect transistor and a first low-side field effect transistor both coupled to an input to the first output inductor. The method further comprises alternately turning on the first high-side field-effect transistor and the first low-side field-effect transistor at a switching frequency, wherein only one of the first high-side field-effect transistor and the first low-side field-effect transistor are turned on at any point in time. The method still further comprises measuring a change in the inductance of the first output inductor resulting from the first output inductor reaching current saturation and measuring a rate of change in the output current of the first output inductor. Then, the method controls the switching frequency as a function of the measured change in the inductance and the measured rate of change in the output current in order to prevent an amount of current through the first high-side field-effect transistor from exceeding a maximum operating current setpoint for the first high-side field-effect transistor.

The foregoing computer program products may further include program instructions for implementing or initiating any one or more aspects of the methods described herein. Accordingly, a separate description of the methods will not be duplicated in the context of a computer program product.

FIG. 1 is a chart of open loop inductance (% of OCL) as a function of current saturation (% of $I_{sat}$) illustrating a drop off in inductance, and the resulting increase in current ripples, as an inductor approaches and exceeds 100% current saturation. The "current ripple" illustrates that fluctuations in current increase significantly as the inductance drops off. These large current ripples pose a threat of damaging the high-side field-effect transistors of the voltage regulator.

Figure 2:
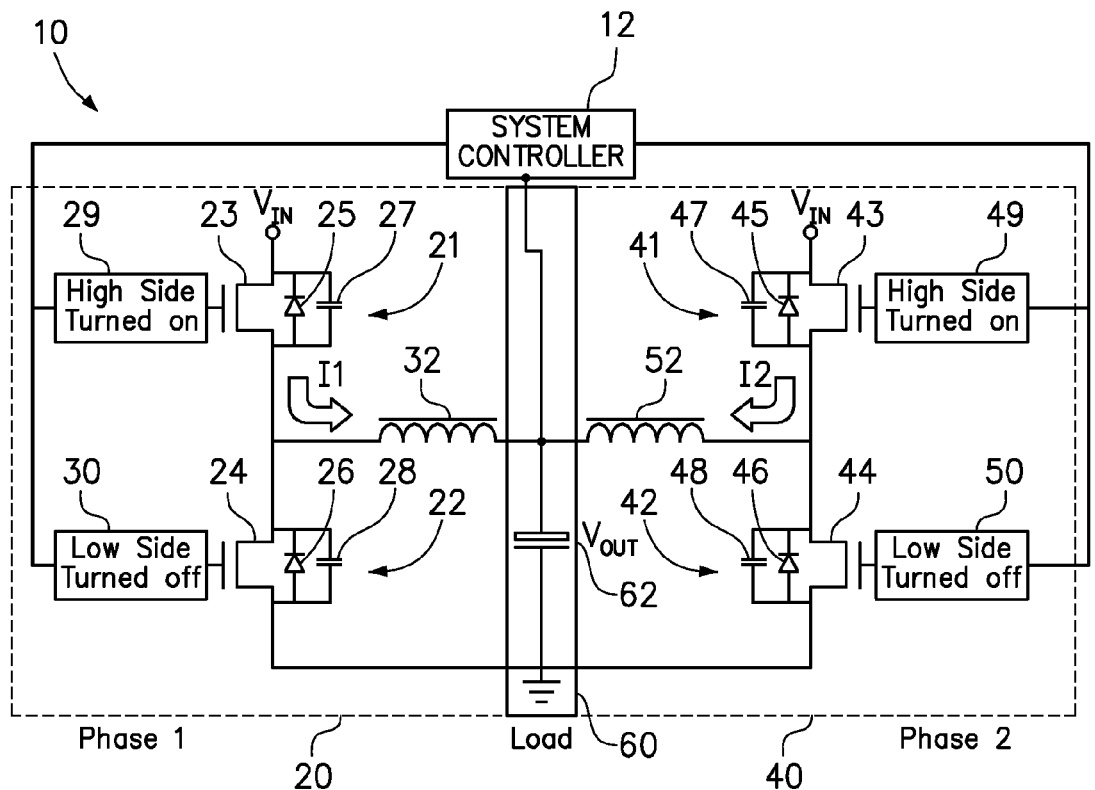
FIG. 2 is a circuit diagram of a voltage regulator circuit.

FIG. 2 is a circuit diagram of a voltage regulator 10 supplying power to a load 60. The voltage regulator 10 includes a system controller 12, a first phase 20, and a second phase 40. The first phase 20 includes a first power stage 21 and a second power stage 22, wherein the first power stage 21 includes a first high-side field-effect transistor 23, a diode 25, a capacitor 27 and a first high-side control block 29, and the second power stage 22 includes a first low-side field-effect transistor 24, a diode 26, a capacitor 28, and a low-side control block 30. Both the first high-side field-effect transistor 23 and the first low-side field-effect transistor 24 are coupled to an input of the first output inductor 32.

The second phase 40 includes a first power stage 41 and a second power stage 42, wherein the first power stage 41 includes a second high-side field-effect transistor 43, a diode 45, a capacitor 47 and a second high-side control block 49, and the second power stage 42 includes a second low-side field-effect transistor 44, a diode 46, a capacitor 48, and a second low-side control block 50. Both the second high-side field-effect transistor 43 and the second low-side field-effect transistor 44 are coupled to an input of the second output inductor 52.

The system controller is in communication with each of the control blocks to control the switching frequency of each field-effect transistor. Specifically, the system controller 12 will alternately (or asynchronously) turn on the first high-side field-effect transistor 23 and the first low-side field-effect transistor 24 at a switching frequency, wherein only one of the first high-side field-effect transistor and the first low-side field-effect transistor are turned on at any point in time. The system controller 12 measures a change in the inductance of the first output inductor 32 resulting from the first output inductor reaching current saturation and measuring a rate of change in the output current of the first output inductor. The system controller 12 controls the switching frequency as a function of the measured change in the inductance and the measured rate of change in the output current in order to prevent an amount of current through the first high-side field-effect transistor 23 from exceeding a maximum operating current setpoint for the first high-side field-effect transistor.

Furthermore, the system controller 12 will alternately turn on the second high-side field-effect transistor 43 and the second low-side field-effect transistor 44 at the switching frequency, wherein only one of the second high-side field-effect transistor and the second low-side field-effect transistor are turned on at any point in time. Still further, the system controller 12 may coordinate operation of the first and second phases 20, 40 so that only one of the first high-side field-effect transistor 23 and the second high-side field-effect transistor 43 are turned on at any point in time.

The system controller is shown in communication with the outputs of the two output inductors 32, 52 in order to measure the output current from either output inductor or the inductance of either output inductor. For this purpose, the voltage regulator may include any one or more of various current measurement technologies, such as a current mirror, RDSon (i.e., the series resistance of a MOSFET when it is fully enhanced) and DCR (i.e., the series resistance of an inductor used to measure DC current). As a result, the system controller 12 can measure output current, and determine the amplitude of the output ripple current or the slew rate (i.e., output voltage divided by output inductance).

The system controller 12 may monitor the voltage regulator and measure/detect, determine or set the value of the parameters shown in Table 1, below. The system controller can use Equation 1 to determine the change in inductance ($\Delta Lsys$).

$$\Delta Lsys = -Vout * D' * \Delta Ts / \Delta I \qquad \text{Equation 1:}$$

TABLE 1

| | | |
|---|---|---|
| Vin | Input voltage of system | Measured |
| Vout | Output voltage of system | Measured |
| $\Delta Ts$ | Time Difference between time sample 1 and 2 | Set by controller |
| K1 | Porportional gain term of feedback of Inductance | Set by controller |
| Fsw | System Switching Frequency | Set by controller |
| $\Delta I$ | Change in current from sample time 1 and Sample time 2 | Measured |
| $\Delta Lsys$ | Relative change in system inductance (Units = Henries) | Calculated |
| D' | Percentage of time at which the low side FET is on. For example, D' = (1-Vout/Vin) | |

Then, the switching frequency to be applied to the field-effect transistors may be determined using the following Equation 2:

$$Fsw = K_1 * Vout * D' / \Delta Lsys * \Delta I \qquad \text{Equation 2:}$$

$K_1$ is a constant that is used to stabilize the feedback loop by controlling how fast the system responds to the amount of change in switching frequency. This quantity may be changed with respect to the composition of the core material, where the k1 factor may be very high for a ferrite core, and lower for a composite core.

The system controller 12 may use the foregoing measurements and calculations to change the switching frequency of the voltage regulator and thereby protect the system, and upstream power stages. The increase in switching frequency limits the amount of current that the upstream power stages are allowed to ramp up to. This further allows the voltage regulator to operate well past the current saturation point to have lower effective inductance during high transient events. The smallest inductance that may be supported without damaging upstream components will depend on the maximum switching frequency supported by the system controller.

Figure 3:
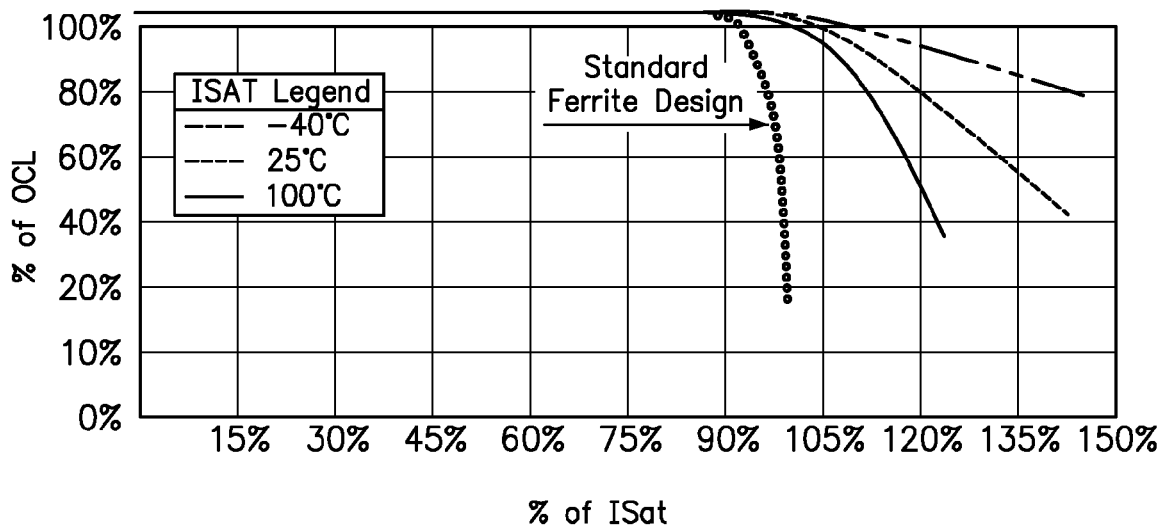
FIG. 3 is a chart of open loop inductance as a function of current saturation illustrating the sharp drop off in inductance of an inductor with a ferrite core at three different temperatures.

FIG. 3 is a chart of open loop inductance (% of OCL) as a function of current saturation (% of $I_{sat}$) illustrating the sharp drop off in inductance of an inductor with a ferrite core compared with the decline in inductance of an inductor having a composite core.

Embodiments of the present invention may take advantage of an inductor whose core structure has a soft saturation region. Since the current saturation of an inductor core made with a ferrite material will fall off really fast, as shown in FIG. 3, the inductor core must be over-designed to ensure that the worst-case current rating (including all current ripple, and mismatch current between multiple phases) will not exceed the rated current saturation (Isat) of the high-side field-effect transistor. The present invention uses an inductor having a composite core including other materials that allows the roll off of the inductance with respect to current and temperature to be a lot slower, such that protection schemes may be implemented in a timely manner. Using an output inductor with an inductor core having a slower rate of current saturation, the current ripple can be measured by the system controller and used for control of the switching frequency.

Figure 4:
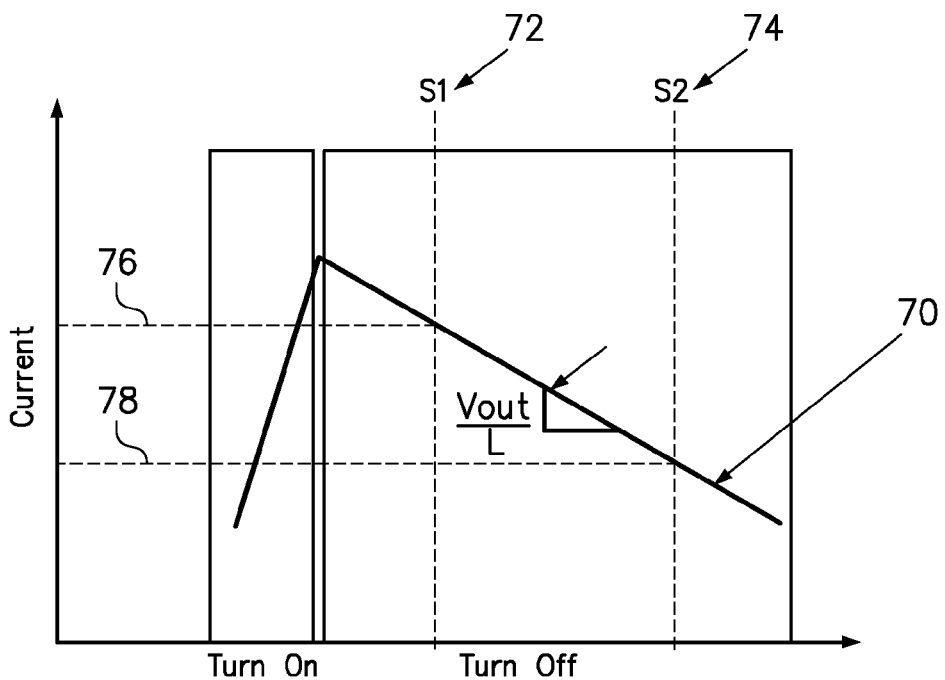
FIG. 4 is a diagram illustrating a slew rate of a current ripple between first and second sample times.

FIG. 4 is a diagram of a current ripple 70 illustrating the measurement of a slew rate between a first sample time (S1) 72 and a second sample time (S2) 74. The slew rate is the rate of change in output current with respect to time. The amount of current 76 is measured at the first sample time 72 and the amount of current 78 is again measures at the second sample time 74. The rate of change in the output current (or slew rate) may be determined dividing the difference in the first output current 76 and the second output current 78 by the difference in the first sample time 72 and the second sample time 74.

Figure 5:
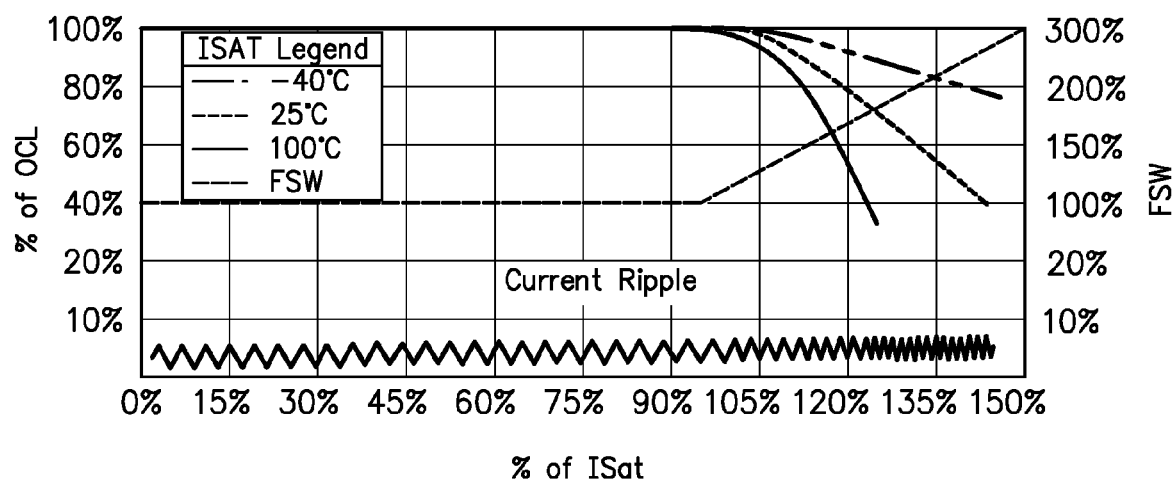
FIG. 5 is a chart of open loop inductance as a function of current saturation illustrating a drop off in inductance as an inductor exceeds the 100% current saturation, and illustrating that current ripples can be controlled by increasing the switching frequency of the FETs in the voltage regulator.

FIG. 5 is a chart of open loop inductance (% of OCL) as a function of current saturation (% of $I_{sat}$) illustrating a drop off in inductance as an inductor exceeds the 100% current saturation, and illustrating that current ripples can be controlled by increasing the switching frequency of the FETs in the voltage regulator as a function of the measured change in the inductance and the measured rate of change in the output current.

Figure 6:
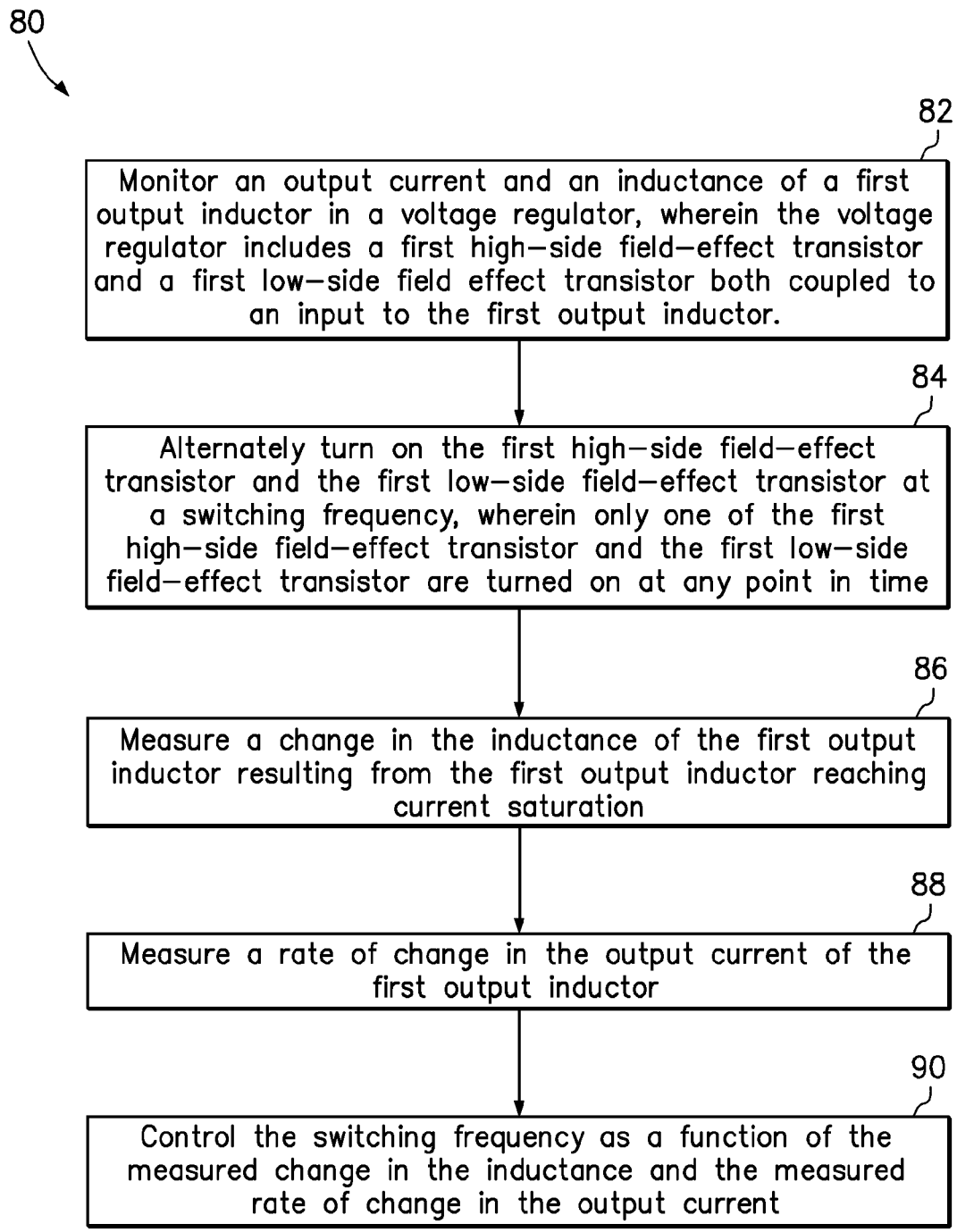
FIG. 6 is a flowchart of a method in accordance with one embodiment of the present invention.

FIG. 6 is a flowchart of a method 80 in accordance with one embodiment of the present invention. In step 82, the method monitors an output current and an inductance of a first output inductor in a voltage regulator, wherein the voltage regulator includes a first high-side field-effect transistor and a first low-side field effect transistor both coupled to an input to the first output inductor. Step 84 alternately turns on the first high-side field-effect transistor and the first low-side field-effect transistor at a switching frequency, wherein only one of the first high-side field-effect transistor and the first low-side field-effect transistor are turned on at any point in time. Step 86 includes measuring a change in the inductance of the first output inductor resulting from the first output inductor reaching current saturation and step 88 includes measuring a rate of change in the output current of the first output inductor. Then, in step 90, the method controls the switching frequency as a function of the measured change in the inductance and the measured rate of change in the output current in order to prevent an amount of current through the first high-side field-effect transistor from exceeding a maximum operating current setpoint for the first high-side field-effect transistor.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electromagnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing. Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention may be described with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, and/or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, components and/or groups, but do not preclude the presence or addition of one or more other features, integers, steps, operations, elements, components, and/or groups thereof. The terms "preferably," "preferred," "prefer," "optionally," "may," and similar terms are used to indicate that an item, condition or step being referred to is an optional (not required) feature of the invention.

The corresponding structures, materials, acts, and equivalents of all means or steps plus function elements in the claims below are intended to include any structure, material, or act for performing the function in combination with other claimed elements as specifically claimed. The description of the present invention has been presented for purposes of illustration and description, but it is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A method, comprising:
monitoring an output current and an inductance of a first output inductor in a voltage regulator, wherein the voltage regulator includes a first high-side field-effect transistor and a first low-side field effect transistor both coupled to an input to the first output inductor;
alternately turning on the first high-side field-effect transistor and the first low-side field-effect transistor at a switching frequency, wherein only one of the first high-side field-effect transistor and the first low-side field-effect transistor are turned on at any point in time;
measuring a change in the inductance of the first output inductor resulting from the first output inductor reaching current saturation;
measuring a rate of change in the output current of the first output inductor; and
controlling the switching frequency as a function of the measured change in the inductance and the measured rate of change in the output current in order to prevent an amount of current through the first high-side field-effect transistor from exceeding a maximum operating current setpoint for the first high-side field-effect transistor.

2. The method of claim 1, wherein preventing the amount of current through the first high-side field-effect transistor from exceeding the maximum operating current setpoint for the first high-side field-effect transistor prevents damage to the first high-side field-effect transistor.

3. The method of claim 1, wherein the first output inductor has a core that is a composite material exhibiting a soft current saturation region.

4. The method of claim 3, wherein the core is characterized by an inductance that declines slower with respect to increasing current than a ferrite core.

5. The method of claim 1, wherein the voltage regulator has multiple phases operating in parallel between a voltage source and a load.

6. The method of claim 1, wherein the voltage regulator includes a first phase and a second phase, wherein the first phase includes the first high-side field-effect transistor, the first low-side field-effect transistor and the first output inductor, wherein the second phase includes a second high-side field-effect transistor, a second low-side field-effect transistor, and a second output inductor coupled to outputs of the second high-side field-effect transistor and the second low-side field-effect transistor, and wherein the first and second output inductors having outputs coupled to a load.

7. The method of claim 6, further comprising:
alternately turning on the second high-side field-effect transistor and the second low-side field-effect transistor at the switching frequency, wherein only one of the second high-side field-effect transistor and the second low-side field-effect transistor are turned on at any point in time, and wherein only one of the first high-side field-effect transistor and the second high-side field-effect transistor are turned on at any point in time.

8. The method of claim 1, wherein determining a rate of change in the output current of the first output inductor, includes measuring a first output current at a first sample time, measuring a second output current at a second sample time, and dividing the difference in the first output current and the second output current by the difference in the first sample time and the second sample time.

9. The method of claim 1, wherein controlling the switching frequency as a function of the measured change in the inductance and the measured rate of change in the output current, includes controlling the switching frequency according to the equation:

$$Fsw=K_1*\Delta Lsys*\Delta I$$

wherein: Fsw is the switching frequency;
$\Delta$Lsys is the measured change in the inductance;
$\Delta I$ is the measured rate of change in the output current; and
$K_1$ is a proportional gain constant.

10. A computer program product for controlling a voltage regulator, the computer program product comprising a non-transitory computer readable storage medium having program instructions embodied therewith, the program instructions executable by a processor to cause the processor to perform a method comprising:
monitoring an output current and an inductance of a first output inductor in the voltage regulator, wherein the voltage regulator includes a first high-side field-effect transistor and a first low-side field effect transistor both coupled to an input to the first output inductor;
alternately turning on the first high-side field-effect transistor and the first low-side field-effect transistor at a switching frequency, wherein only one of the first high-side field-effect transistor and the first low-side field-effect transistor are turned on at any point in time;
measuring a change in the inductance of the first output inductor resulting from the first output inductor reaching current saturation;
measuring a rate of change in the output current of the first output inductor; and
controlling the switching frequency as a function of the measured change in the inductance and the measured rate of change in the output current in order to prevent an amount of current through the first high-side field-effect transistor from exceeding a maximum operating current setpoint for the first high-side field-effect transistor.

11. The computer program product of claim 10, wherein preventing the amount of current through the first high-side field-effect transistor from exceeding the maximum operating current setpoint for the first high-side field-effect transistor prevents damage to the first high-side field-effect transistor.

12. The computer program product of claim 10, wherein the first output inductor has a core that is a composite material exhibiting a soft current saturation region.

13. The computer program product of claim 12, wherein the core is characterized by an inductance that declines slower with respect to increasing current than a ferrite core.

14. The computer program product of claim 10, wherein the voltage regulator has multiple phases operating in parallel between a voltage source and a load.

15. The computer program product of claim 10, wherein the voltage regulator includes a first phase and a second phase, wherein the first phase includes the first high-side field-effect transistor, the first low-side field-effect transistor and the first output inductor, wherein the second phase includes a second high-side field-effect transistor, a second low-side field-effect transistor, and a second output inductor coupled to outputs of the second high-side field-effect transistor and the second low-side field-effect transistor, and wherein the first and second output inductors having outputs coupled to a load.

16. The computer program product of claim 15, the method further comprising:
alternately turning on the second high-side field-effect transistor and the second low-side field-effect transistor at the switching frequency, wherein only one of the second high-side field-effect transistor and the second low-side field-effect transistor are turned on at any point in time, and wherein only one of the first high-side field-effect transistor and the second high-side field-effect transistor are turned on at any point in time.

17. The computer program product of claim 10, wherein determining a rate of change in the output current of the first output inductor, includes measuring a first output current at a first sample time, measuring a second output current at a second sample time, and dividing the difference in the first output current and the second output current by the difference in the first sample time and the second sample time.

18. The computer program product of claim 10, wherein controlling the switching frequency as a function of the measured change in the inductance and the measured rate of change in the output current, includes controlling the switching frequency according to the equation:

$$Fsw = K_1 * \Delta Lsys * \Delta I$$

wherein: Fsw is the switching frequency;
$\Delta Lsys$ is the measured change in the inductance;
$\Delta I$ is the measured rate of change in the output current; and
$K_1$ is a proportional gain constant.

* * * * *